United States Patent [19]

Nishizawa

[11] 4,427,990
[45] Jan. 24, 1984

[54] SEMICONDUCTOR PHOTO-ELECTRIC CONVERTER WITH INSULATED GATE OVER P-N CHARGE STORAGE REGION

[75] Inventor: Jun-ichi Nishizawa, Sendai, Japan

[73] Assignee: Zaidan Hojin Handotai Kenkyu Shinkokai, Sendai, Japan

[21] Appl. No.: 39,445

[22] Filed: May 15, 1979

[30] Foreign Application Priority Data

Jul. 14, 1978 [JP] Japan .................................. 53-86572
Jul. 18, 1978 [JP] Japan .................................. 53-87988

[51] Int. Cl.³ ............................................ H01L 29/80
[52] U.S. Cl. ........................................ 357/22; 357/23; 357/30; 357/43; 357/56
[58] Field of Search ....................... 357/22, 23, 38, 43, 357/21, 56, 30

[56] References Cited

U.S. PATENT DOCUMENTS

| | | | |
|---|---|---|---|
| 3,987,474 | 10/1976 | Walker | 357/23 |
| 4,000,504 | 12/1976 | Berger | 357/23 |
| 4,326,210 | 4/1982 | Aso et al. | 357/22 |

FOREIGN PATENT DOCUMENTS 1393792 5/1975 United Kingdom .
1396198 6/1975 United Kingdom .
1434652 5/1976 United Kingdom .
1477467 6/1977 United Kingdom .

OTHER PUBLICATIONS

R. Chen et al., "A Bilateral Analog FET Optocoupler," IEEE Trans. on Con. Elec., vol. CE-24, #3, Aug. 1978, pp. 247-260.

Primary Examiner—Joseph E. Clawson, Jr.
Attorney, Agent, or Firm—Cushman, Darby & Cushman

[57] ABSTRACT

A high sensitivity semiconductor photo-electric converter is provided by electrically isolating the gate region of a static induction transistor which exhibits non-saturating current versus voltage characteristic. Optically ionized minority carriers are stored in the gate region to control the potential thereof. A semiconductor gate region provided with a insulated gate is very effective to enhance the dynamic range of the converter. Non-saturating characteristic enables enlargement of the output current simply by increasing the drain voltage. A high-speed and high sensitivity image pick-up device can be materialized by integrating a multiplicity of the static induction type photo-electric converter elements. A switching transistor may be merged in the gate region of each photo-electric converter element to enhance the operation speed of the image pick-up device.

6 Claims, 19 Drawing Figures

SEMICONDUCTOR PHOTO-ELECTRIC CONVERTER WITH INSULATED GATE OVER P-N CHARGE STORAGE REGION

CROSS REFERENCE TO THE RELATED APPLICATION

This is a continuation-in-part of my copending application Ser. No. 757,583 filed on Dec. 27, 1976, now U.S. Pat. No. 4,160,259.

BACKGROUND OF THE INVENTION (a) Field of the invention

The present invention relates to a semiconductor photo-electric converter, and more particularly it concerns a static induction type semiconductor photo-electric converter.

(b) Description of the prior art

As known semiconductor photo-electric converters, there are photo-conductive light detectors, photo-diodes, photo-transistors and like devices. A known bipolar type photo-transistor has a structure similar to that of a known bipolar transistor, and is operative so that those carriers which are generated by light are accumulated in the base region of the transistor to control the emitter current.

On the other hand, a static induction transistor has been proposed by Jun-ichi Nishizawa, present inventor, in, for example, U.S. Ser. No. 817,052 and by Jun-ichi Nishizawa et al in U.S. Ser. No. 576,541, which is capable of exhibiting a non-saturating type current versus voltage characteristic in contrast to known bipolar transistors and known field effect transistors which exhibit saturating type current versus voltage characteristic. The static induction transistor (hereinafter to be called simply SIT) has greatly advanced the art in the past.

A static induction transistor is designed so that its series resistance from the source region to the intrinsic gate (the region in which the drain current is substantially controlled) is very small, and that it has a large transconductance. The impurity concentration of the channel region is selected low and the width of the channel region is selected small so that the channel region can be pinched off by the depletion layer extending from the gate, so as to form an intrinsic gate of potential barrier type. Also, the gate length is selected short to provide very small series resistance.

Also, in case a potential barrier is produced in the intrinsic gate region, the height of this potential barrier can be controlled by either one of the gate potential and the drain potential, and these constitute a cause for being able to exhibit a non-saturating type current versus voltage characteristic. The SIT has a further convenience that its gate capacitance can be made very small due to a very small gate length structure, so that it is suitable for high-speed and low power dissipation operation. However, no optical static induction type semiconductor device has been proposed yet.

An image pick-up device can be constituted by integrating photoelectric semiconductor elements. Such image pick-up devices vary in kinds. An all-solid image pick-up device which requires no application of high voltage or no provision of vacuum. Accordingly, image pick-ups which employ a semiconductor charge transfer (charge coupled) device have been proposed. A charge transfer device has the advantages that it has a simple structure and that it has a high packing density. However, the electric charge which forms an output signal is comprised of those carriers which are ionized by exposure to light and which are stored in such region as MOS capacitor. Therefore, if the amount of light irradiated on the device is not abundant, the electric charge which is stored will be small. Therefore, it is typically not possible to obtain a large signal with such devices if the light is weak. Furthermore, leakage of the stored electric charge often occurs when it is being transferred.

Another image pick-up device using a MOS transistor as a light-detector has also been proposed. The detection of light, however, is carried out by utilizing the pn junction at the source region as a photo-diode. Therefore, this known image pick-up device has similar problems as described with respect to the charge transfer device, for example, sensitivity to light.

SUMMARY OF THE INVENTION

It is, therefore, an object of the present invention to provide a high sensitivity semiconductor photo-electric converter incorporating the principles of a static induction transistor.

Another object of the present invention is to provide a semiconductor image pick-up device employing a new transistor structure.

BRIEF DESCRIPTION OF THE DRAWINGS

FIGS. 3A, 3B, 3C and 3D show respective embodiments of the phototransistor employed in the structure of FIG. 1, in which:

FIG. 3A is a diagrammatic sectional view of an embedded-gate type structure;

FIG. 3B is a diagrammatic sectional view of an embodiment of a surface-gate type structure;

FIG. 3C is a diagrammatic sectional view of an embodiment of a recessed-gate type structure; and FIG. 3D is a schematic diagrammatic sectional view of an embodiment of a lateral type structure.

FIGS. 11A, 11B, 11C and 11D show an embodiment of an image pick-up device according to the present invention, in which:

FIG. 11A is a diagrammatic sectional view of an image pick-up element;

FIG. 11B is a schematic plan view of the image pick-up device including a multiplicity of elements of FIG. 11A;

FIG. 11C is a schematic equivalent circuit diagram of the image pick-up element of FIGS. 11A and 11B; and FIG. 11D is a schematic partial circuit diagram of the solid image pick-up device.

DETAILED DESCRIPTION OF THE PREFERRED EMBODIMENTS

Figure 1:
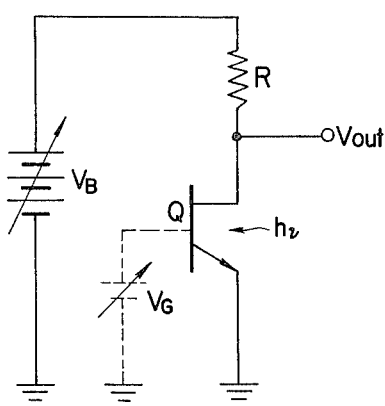
FIG. 1 is a circuit diagram of a basic embodiment of the semiconductor photo-electric converter according to the present invention.

FIG. 1 shows a circuit diagram for explaining the basic embodiment of the present invention. An n-channel junction static induction transistor Q has its source grounded, and its drain connected to a positive voltage supply $V_B$ via a load resistor R. An output terminal $V_{out}$ is connected at the connection between the drain and said load resistor R. When light $h\nu$ impinges on the static induction transistor, electron-hole pairs are generated within the channel region, and at least part of the holes thus produced are stored in the p type gate region, causing the gate potential $V_G$ to rise. The electromotive force due to this irradiation of light is indicated by a variable voltage supply $V_G$ in the equivalent circuit. The output (drain) voltage $V_{out}$ varies depending on the magnitude of the gate potential $V_G$ produced as the result of irradiation of light, so that the amount of irradiating light can be known.

Figure 2:
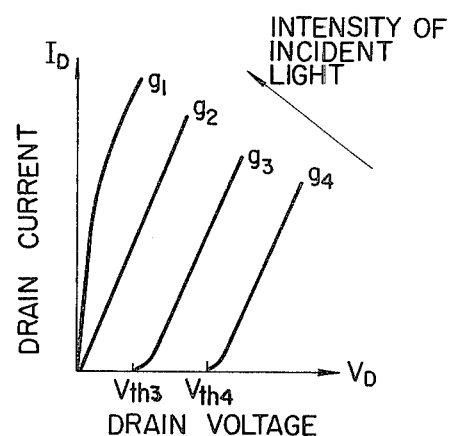
FIG. 2 is a chart showing the characteristic of the photo-detector employed in the device of FIG. 1.

FIG. 2 shows the characteristic of a static induction photo-transistor having its channel region sufficiently pinched off at zero gate bias. In FIG. 2, lines $g_1$-$g_4$ represent I-V curves due to variation of the amount of light received. Line $g_4$ represents the zero bias characteristic of this photo-transistor in which the built-in potential at the pn junction between the gate region and the channel region works as a reverse bias so that the channel region is sufficiently pinched off by the depletion layer. In this case, there is required a certain drain voltage $V_{th}$ in order to lower the potential barrier at the intrinsic gate and to thereby cause a current to flow. Namely, denoting the impurity concentration of the channel region as $N_D$ and that of the gate region as $N_A$, the built-in potential at the junction is determined as a function of $N_D$ and $N_A$ and the depletion layer grows around the junction by this built-in voltage (see, for example, S. M. Sze "Physics of Semiconductor Devices", chapter 3, published by John Wiley & Sons Inc. New York, 1969). When the gate-to-gate distance is small enough, the depletion layers overlap and pinch off the channel region.

When a light is irradiated onto this photo-transistor, electron-hole pair generation occurs. The resulting positive holes are stored in the p type gate region which has a lower potential for the holes, to thereby bias this gate region forwardly. That is, a bias voltage is produced between the gate region and the channel region, which is the sum of the built-in potential (reverse bias) and the electromotive force (forward bias) produced as a result of irradiation by light. This electromotive force is determined by the amount of absorbed light, or in other words, by the amount of electric charge stored in the gate region and the gate capacitance. In accordance with an increase in the amount of irradiated light, the forward gate bias increases and the characteristic curves will vary in the order of lines $g_3$, $g_2$ and $g_1$. Line $g_2$ corresponds to the state that a neutral region has begun to appear within the channel region. At line $g_1$, the depletion layer has shrunk to leave neutral channel region so that a resistive characteristic appears.

Figure 3A:
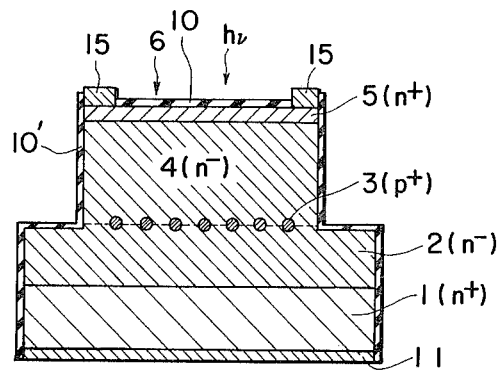
Figure 3B:
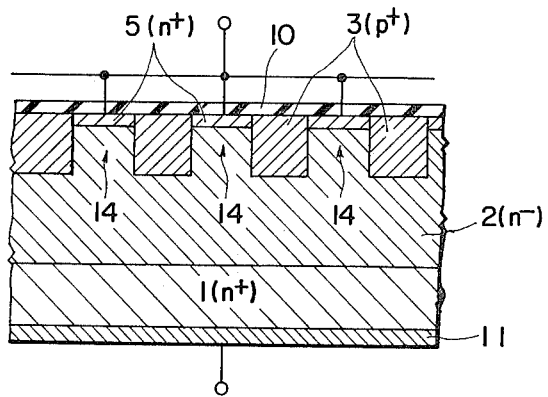
Figure 3C:
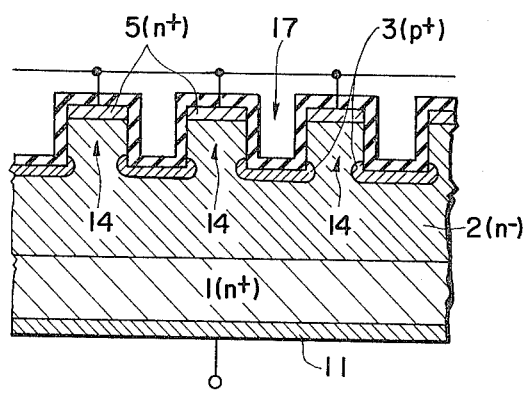

FIGS. 3A, 3B and 3C show embodiments of the photo-transistor which is used in the structure shown in FIG. 1. In FIG. 3A is shown an embodiment of embedded-gate type structure. On top of an n+ type silicon substrate 1 is grown an n− type epitaxial layer. On top of this epitaxial layer is formed a p+ type stripe or mesh gate region 3. Furthermore, on top of this mesh gate region 3 is grown an n− type epitaxial layer 4, and a thin n+ type layer 5 is formed on the surface. An electrode 11 made of a metal or a low resistivity polysilicon is formed on the entire bottom surface of the substrate 1, and similar electrode 15 is formed on the peripheral portions on the upper surface of the n+ type layer 5. The portion surrounded by said electrode 15 serves as the light-receiving portion. No electrode is formed for the gate region 3. Therefore, the gate region 3 is electrically isolated and can be used as a carrier storage region.

The substrate 1 is used as the source region, and the n+ type region 5 is used to serve as the drain region. The thickness of this n+ type region 5 is selected to be sufficiently small so as to minimize the attenuation of the irradiating light, for example the thickness may be 0.3-0.5 μm. The n− type layer 4 is a region located between the gate region and the drain region, to determine the magnitude of the maximum drain voltage applied, the sensitivity to light or the like. The thickness of this region is selected so that the major portion of the region which absorbs the incident light becomes depleted so that the majority of the holes ionized by the incident light are able to reach the gate region 3. In order to elevate breakdown voltage, it is only necessary to reduce the impurity concentration. For a visible light sensitive device, the impurity concentration of this region is, for example, about $10^{14}$ cm$^{-3}$, and the thickness thereof may be about 10-20 μm. The interval or mesh of the p+ type gate regions is selected so that the depletion layers due to the built-in potential at the pn junction sufficiently overlap each other, so that a sufficient potential barrier is formed within the channel region. If, for example, the impurity concentration of the n− type layer which constitutes the channel region is about $1 \times 10^{14}$ cm$^{-3}$ and the impurity concentration of the gate region is about $10^{18}$ cm$^{-3}$, the diameter of mesh is selected to be less than about 5 μm, preferably between 2 and 3 μm. The n− type region 2 is a region located between the source region and the gate region, for determining the current level and the sensitivity to light, jointly by the n− type layer 4. For example, the impurity concentration and the thickness of this n− type region 2 are selected so that the former is about $1 \times 10^{14}$ cm$^{-3}$ and the latter is about 2-3 μm. The impurity concentration of the n+ type substrate is not subject to any particular limitation, but a substrate having an impurity concentration of, for example, $10^{18}$-$10^{20}$ cm$^{-3}$ is selected. In order to obtain a large dynamic range of the output voltage, it is also effective to lower the impurity concentration of the n− type region 4 and to elevate the drain voltage which is applied. Where the wavelength of the light to be detected is long and, accordingly, the light-absorption coefficient becomes low, the distance between the gate region and the drain region, i.e. the thickness of the n− type layer 4, can be increased.

It is also possible, in the structure shown in FIG. 3A, to reverse the roles of the source region and the drain region. That is, the n+ type region 5 can be used as the source region and the n+ type region 1 can be used to serve as the drain region. In such an instance, the distance between the source region 5 and the gate region 3, i.e. the thickness of the n⁻ type region 4, is arranged to be shorter, and the distance between the gate region 3 and the drain region 1, i.e. the thickness of the n⁻ type region 2, is increased. The gate region 3 is electrically floated in the n⁻ type channel regions 2 and 4, similar to the foregoing arrangement.

When the substrate is used as the drain region, the n⁻ type region 4 formed on the p+ type mesh gate region becomes the source-side channel region and hence may be no longer thick but preferably thin. Therefore, the formation of this n⁻ type region 4 after the formation of p+ type heavily doped gate region 3 can be achieved in a short period. This makes the manufacture of the device easier.

The most photo-sensitive region is the drain side channel region since a strong field can be established therein. Therefore, it is preferable to provide light-receiving window on the drain side. When the substrate is used as the drain, the electrode 11 may be partially removed and the n+ type substrate 1 may be selectively etched thin to provide a light-receiving portion thereat. Use of n⁻ type substrate which serves as the drain side channel region is also possible. In FIG. 3A, thin oxide film 10 passivates the light-receiving portion. Another passivation member 10' may be formed thick.

In FIG. 3B, there is shown an embodiment of the surface-gate type structure. On top of an n+ type silicon semiconductor substrate 1 is formed an n⁻ type epitaxial layer 2. In this epitaxial layer 2, there are formed an n+ type region 5 having a small depth and a p+ type region 3 having a greater depth and substantially surrounding the n+ type region 5. If the n+ type region 5 is used as the source region, it should be understood that, since the gate region 3 is preferably located close to the source region, this gate region may have a structure as that illustrated. In case, however, the n+ type region 5 is used as the drain region, the gate region 3 is preferably located closer to the n+ type region 1 which is to serve as the source region. The n+ type region 5 and the p+ type gate region 3 may be formed by relying on the diffusion technique, but it is preferred to form these two regions by relying on the ion-implantation technique. The width of the channel region 14, which is such part of the n⁻ type region 2 that is surrounded by the p+ type gate region 3, is selected so that the channel becomes sufficiently pinched off by the built-in potential between the n⁻ type region 2 and the p+ type region 3. By locally exposing the insulating film 10 provided on the n+ type region 5, there is formed an electrode (not shown). This structure has an advantage of easy manufacture, and is suited especially for normal type operation in which the substrate 1 is used as the drain region.

In FIG. 3C, there is shown an embodiment of a recessed-gate structure. From one surface of a wafer toward the internal portion of this wafer, there is formed a recessed portion 17, and a gate region 3 is formed on the bottom of this recessed portion 17. This structure is effective to reduce the gate capacitance because the gate region is reduced in size, so that such structure is superior especially for the detection of weak light.

It can be easily understood that, the smaller the gate region is, the smaller the gate capacitance becomes. Smaller gate capacitance can provide a large gate potential by storing a small amount of electric charge. Since the region between the gate and the drain region is usually subjected to depletion and used as a larger part of optically active region, it is preferable to use the n+ type region (substrate) 1 as the drain and the n+ type region 5 as the source.

Figure 3D:
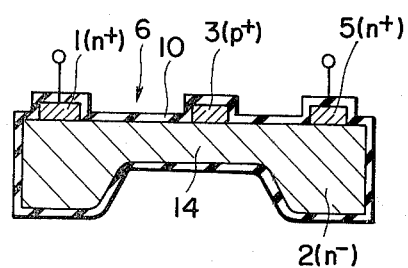

FIG. 3D schematically shows a lateral structure, in which current electrode regions are formed in the same principal surface to allow a lateral flow of charge carriers.

An n⁻ type substrate 2 is selectively etched from one surface to reduce the thickness at a middle portion. A p+ type gate region 3 is formed on the other surface at the portion of reduced thickness and two n+ type regions 1 and 5 are formed on the same surface on the two sides of the p+ type region 3. Namely, a current path is formed between the two n+ type regions 1 and 5 through the n⁻ type region 2. A depletion layer develops from the pn junction between the p+ type gate region 3 and the n⁻ type channel region 14 into the channel region 14. The thickness (width) of the channel region 14 is so selected that the channel is sufficiently pinched off by the built-in potential of the pn junction. Light is irradiated on the surface between the n+ type region 1 and the p+ type region 3 and the optically excited positive holes are stored in the p+ type gate region 3 to vary the gate potential. The n+ type region 5 may be used as the source region and the other n+ type region 1 may be used as the drain region, or vice versa. The shown structure may be formed by selective etching and selective chemical vapor deposition techniques.

It will be apparent that the highly doped regions 1, 3 and 5 may be formed in the n⁻ type region 2 by relying on diffusion, ion-implantation or selective etching/growth techniques. Gate region may be provided on both surfaces to sandwich the channel region. Alternatively, the whole structure can be formed in an n⁻ type well formed in a p type region. Other alterations and modifications will be apparent for those skilled in the art.

In those embodiments stated and illustrated above, the potential of the gate region can be varied only for the limited range from zero up to the built-in potential. In order to vary the gate potential for a more extended range, it is effective to provide a structure as shown in FIG. 4.

Figure 4:
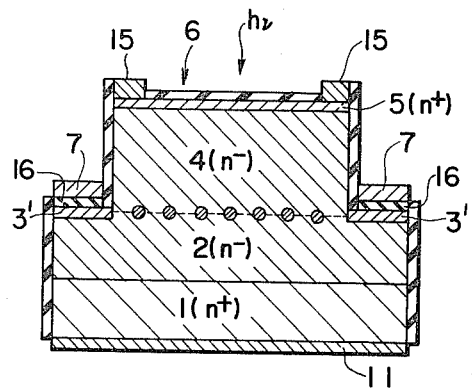
FIG. 4 is a diagrammatic sectional view of an embodiment of another structure of the photo-detector.

In the structure shown in FIG. 4, it will be noted that, an extracted portion 3' of the gate region 3, and a gate electrode 7 which is insulated from the extracted gate region 3' by an insulating layer 16 are further added to the structure of FIG. 3A. This structure allows a bias voltage to be applied externally to the gate region. Such gate structure will hereinafter be called an insulated electrode junction gate structure.

In the instance shown in FIG. 4, it is possible to apply a reverse bias to the gate electrode 7 and to thereby spread the depletion layer extending from the gate region 3 into the channel region 4 (2). Accordingly, the limitation such as the distance between the gate regions can be mitigated. The proportion of the voltage component which is applied between the gate region 3 and the channel region 2 (4) to the total voltage applied to the gate electrode 7 is determined mainly by the ratio of the capacitance $C_1$ between the gate electrode 7 and the extracted gate region 3', to the capacitance $C_2$ between the gate regions 3, 3' and the source region 1. In order to apply a larger voltage component to the gate region 3, it is only necessary to set $C_1$ at a large value, and to reduce the value of $C_2$. Reduction in the width of the insulating layer 16 and/or increase in the opposing area between the gate electrode 7 and the extracted gate region 3' leads to higher value of the capacitance $C_1$. Similarly, reduction in the impurity concentration of the source side channel region 2 and/or increase in the thickness of this source side channel region 2 leads to lower value of the capacitance $C_2$. Similar gate structure may be applied equally effectively to the examples shown in FIGS. 3B, 3C and 3D.

Figure 5:
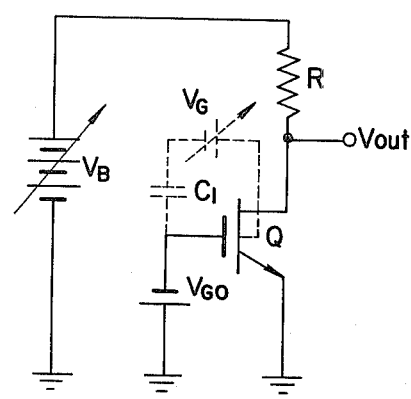
FIG. 5 is a circuit diagram of another embodiment of the semiconductor photo-electric converter according to the present invention using the photo-detector shown in FIG. 4.
Figure 6:
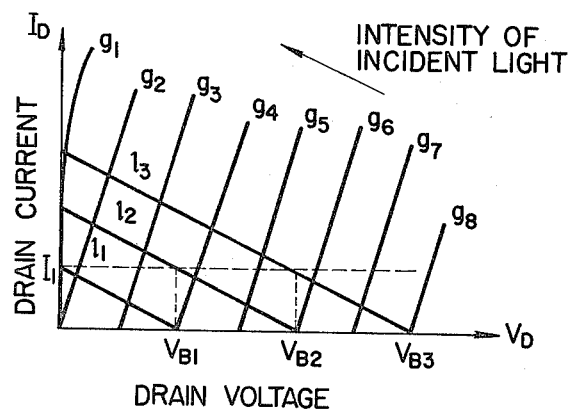
FIG. 6 is a chart showing the characteristic of the photo-detector shown in FIG. 4.

In FIG. 5 is shown an equivalent circuit diagram in the instance wherein a static induction photo-transistor has such insulated-electrode junction gate structure as shown in FIG. 4. When compared with the circuit diagram shown in FIG. 2, there will be noted important differences in that the embodiment of FIG. 5 includes an insulated-gate type transistor, and that a reverse bias voltage supply is connected to the gate electrode. The structure of the static induction transistor shown in FIG. 4 is similar to that shown in FIG. 2 excepting the extracted electrode portions of the gate 7, 16 and 3'. The extracted gate region 3', the insulating layer 6 and the gate electrode 7 constitute a capacitance $C_1$, and a gate bias voltage supply $V_G$ due to photo-electromotive force and an external reverse bias voltage supply $V_{GO}$ are connected via the capacitance $C_1$, so that the gate portion may be expressed as the equivalent circuit diagram indicated by the dotted line. The characteristic curve of this photo-transistor is shown in FIG. 6, which is similar to that of FIG. 2. In this embodiment, however, a reverse bias can be applied externally to the gate structure, so that the channel region does not need to be in its sufficiently pinched-off state at the zero gate bias state of the device. Accordingly, the freedom of designing of the device increases.

In the characteristic curves shown in FIG. 6, $g_1-g_8$ represent the I-V curves showing the variation of the effective gate bias which, in fact, is the sum of the externally applied reverse bias, the forward bias due to photo-electromotive force, and the built-in potential between the gate region and the channel region.

It should be understood that, by increasing the externally applied reverse bias, it is possible to broaden the operation range of the device. By varying the voltage of the drain voltage supply $V_B$, it is possible to vary the load curves in such manner as indicated by $l_1$, $l_2$ and $l_3$. For example, by varying the voltage of the drain voltage supply as $V_{B1}$, $V_{B2}$ and $V_{B3}$, it is possible to measure, within a limited range of drain current, the intensity of incident light ranging from very strong light up to very weak light. The fact that sensitivity to light can be enhanced by an increase in the drain voltage applied represents a feature which can not be obtained from a conventional photo-transistor having a saturating type characteristic.

In the embodiments stated above, those minority carriers which are produced in the channel region due to the irradiation of light are stored in the gate region having an opposite conductivity type. If, however, this gate region is provided in the form of a floating gate structure, the stored electric charge will be left only to discharge through a leakage resistance, so that the speed of response is delayed.

In order to positively cause the stored electric charge to escape, it is only necessary to connect a conduction path between the gate region and the source region. If a resistor is connected, the speed of response will be determined by the capacitance of the gate region and the value of this resistor. This resistor or resistance may be formed within the same semiconductor chip by relying on, for example, the diffusion technique, or it may be formed by, for example, polysilicon.

If a switching means, serving as a conduction path, is connected, the speed of response is determined by the on-off frequency of switching. In such an instance, however, it should be understood that, during the "off" period of this switching means, the electric charge continues to be stored. Accordingly the sensitivity to light can be elevated (sacrificing somewhat the speed of response), by prolonging the "off" period of the switching means. The switching means may be formed by, for example, a transistor, and such an assembly may be integrated in a same semiconductor chip, or alternatively the switching means which is formed by, for example, a mechanical chopper may be attached externally to the device.

The structure of the light-receiving portion is not limited to those structures shown in the above-mentioned examples. For example, the site at which a light-receiving surface is formed may be on the drain side or on the source side, or at any site other than these two. The point is that any site may be used so long as a sufficient amount of light can be introduced into the active channel region in the operative state of the device.

The electrode structure in the instance wherein an electrode is disposed on the light-receiving side as shown in the embodiments of FIGS. 3A to 3C and 4 is not limited to those illustrated. The electrode may be formed either in stripe or mesh form. Alternatively, a transparent electrode may be provided on the entire light-receiving surface.

The semiconductor material also is not limited to silicon, and it should be understood that, for the mesurement of the amount of light having a longer wavelength, there may be employed a semiconductor material having a narrow forbidden gap, such as Ge, $Pb_{1-x}Sn_xTe$ (S, Se), $Hg_{1-x}Cd_xTe$, etc. For the measurement of the amount of light having a shorter wavelength, there can be used a semiconductor material having a broader width of forbidden gap, such as GaAs. Needless to say, the conductivity types of the respective regions may be reversed.

As stated above, by constructing a light detector by the use of a static induction transistor structure, those minority carriers which have been ionized in the channel region by the incident light are stored in the gate region, so that it is possible to derive, as an electric signal (drain current or drain voltage), the intensity of the incident light as a function of the varied gate bias voltage. Especially, if the gate region is provided in the form of an insulated-electrode junction gate structure, the range of operation of the device is broadened, so that such device is suitable for the detection of light covering a wide range of intensity of light.

Description will hereunder be made of an image pickup device which is constructed by integrating in a semiconductor wafer a number of those semiconductor photo-detectors explained above.

Figure 7A:
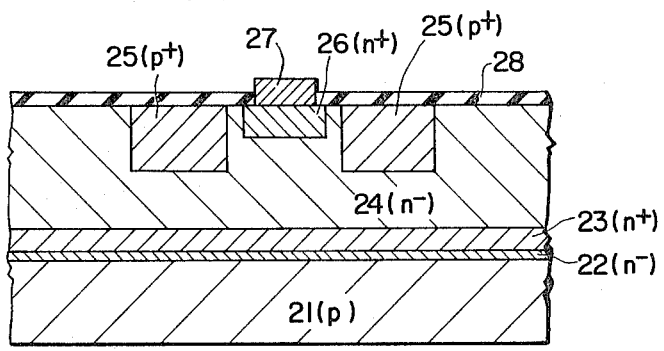
FIGS. 7A and 7B are diagrammatic partial sectional views of an embodiment of the solid image pick-up device according to the present invention.
Figure 7B:
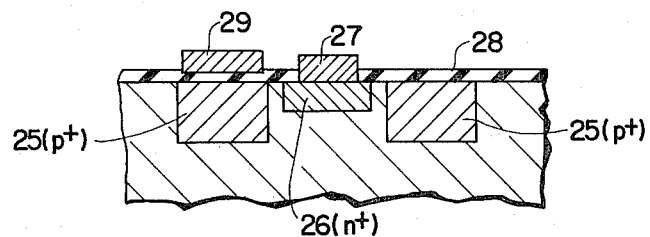

FIG. 7A is a partial sectional view of a semi-conductor image pick-up device, and shows a single image pick-up element (or unit) which constitutes a transistor structure. On a p type silicon substrate 21, there is formed an $n^+$ type drain region 23 surrounded by an $n^-$ type region 22. On top of this drain region 23, there is formed an $n^-$ type silicon epitaxial layer 24. A $p^+$ type gate region 25 and an $n^+$ type source region 26 are formed within said epitaxial layer 24. An electrode 27 is formed on the source region 26. The surface of the epitaxial layer 24 is covered with a transparent insulating film 28. As shown in FIG. 7B, a gate electrode 29 is formed via an insulating layer 28, above a portion of the gate region 25. That is, the gate structure is an insulated-electrode junction gate which is comprised of the electrode 29, the insulating film 28 and the gate region 25. The impurity concentration of the $n^-$ type region 24 is selected sufficiently low, so that, when a predetermined reverse bias (including zero bias) is applied between the source electrode 27 and the gate electrode 29, the channel region becomes sufficiently pinched off to produce a potential barrier, and that this potential barrier can be controlled of its height also by the application of a drain voltage. In other words, there is formed a static induction transistor. The thickness of the insulating film 28 between the gate electrode 29 and the gate region 25 is selected so that the capacitance $C_g$ which is formed by this MIS structure is significant as compared with the capacitance $C_{gs}$ between the gate region 25 and the source region 26. If the capacitance $C_g$ which is formed is excessively small, the majority portion of the voltage applied to the gate electrode will be applied across this capacitance $C_g$, so that the voltage component which is effectively applied between the gate region and the channel region will become small. On the other hand, the potential variation $\Delta V$ of the gate region 25 due to the electric charge $\Delta Q$ which is stored in the gate region as a result of ionization by the incident light depends on the total capacitance $C = C_g + C_{gs}$ of the gate region, so that care should be taken so that this total capacitance C does not become too large.

Description of the operation of this image pick-up unit will be made briefly as follows. While maintaining both the drain region and the source region at a same potential, a predetermined positive voltage is applied to the gate electrode. The $p^+$ type gate region 25 is thus forwardly biased, and if an excessive amount of electrons is stored therein, they are expelled outside the gate region, so that this gate region is rendered to a predetermined state, i.e. the clear state. Next, a predetermined negative voltage is applied to the gate electrode 29, or a predetermined positive voltage is applied to the source electrode 27 and/or to the drain region 23, to thereby reverse bias the gate region 25. At such time, the gate region 25 and the $n^-$ type region 24 constitute a diode which is reverse biased. When, thus, the light which impinges onto this diode after passing through the transparent insulating film 28 produces electron-hole pairs, these holes flow into the gate region 5 and are stored therein. Owing to the stored electric charge $\Delta Q$, the potential V of the gate region 5 will vary: $\Delta V \simeq \Delta Q/C$. Next, when a predetermined positive voltage above a certain value is applied to the drain electrode (not shown) with respect to the source potential, there is allowed to flow a drain current which is determined by the gate potential.

The current-voltage characteristic of the static induction transistor when the channel region is in its pinched-off state due to the applied gate voltage basically follows the exponential law. Accordingly, the variation of the drain current for the variation $\Delta V \simeq \Delta Q/C$ of the gate voltage due to the amount of incident light is very great, so that detection with a very good sensitivity can be carried out. In case it is intended to derive a signal representing an intensity proportional to the amount of the incident light again in the final stage, it is only necessary; as a matter of course, to pass the current through an amplifier which exhibits a characteristic just the reverse of the current-voltage characteristic of said static induction transistor. It should be understood that a static induction transistor is such that its gate capacitance C can be made small, and that its transconductance can be made large, so that a large output signal can be obtained. By resetting the drain voltage at the source potential, and by applying a predetermined positive voltage to the gate electrode 29, the gate region 25 is returned to the clear state. By repeating this cycle, a continuous detection of the amount of incident light can be carried out.

The potential of the gate region 25 is determined by the voltage component of the externally applied reverse bias voltage and the voltage $\Delta V \simeq \Delta Q/C$ due to the stored electric charge $\Delta Q$, and the sum of these two can not exceed the built-in potential. Accordingly, in order to broaden the dynamic range, it is effective to increase the reverse bias voltage which is to be applied. By designing the device so as to have a large voltage amplification factor, the application of a reverse voltage (in case of n type source region, positive voltage) to the source region has an effect equal to the instance wherein a reverse voltage (in case of p type gate region, negative voltage) is applied to the gate region.

While it is to be understood that the clear state need only be a certain constant state, (i.e. it may be neutral state or positively charged state or negatively charged state), an effect equal to that of a reverse bias application will be produced if the gate region is rendered to a state of shortage of carriers. Therefore, in order to broaden the dynamic range, it is desirable to arrange the clear pulse so that, in case the gate region is of a p(n) type, the gate region is kept in its negatively (positively) charged state or at least in its neutral state. The distance between the gate regions i.e. the width of the channel region, desirably is arranged so that the channel region is sufficiently pinched off in the clear state of the device. From the structural point of view, it is also possible to interchange the source region and the drain region.

In the image pick-up device, it is more convenient to set the source potential and the drain potential at equal potentials during the charge storing period. Then, the depletion layer from the gate region (which is the main optically active region) extends equally to the source side and to the drain side. The part of the channel region between the gate region and the drain region may not be totally depleted and some neutral region may exist near the drain region. For maximizing the charge storing efficiency, it is advantageous to dispose the gate region near the central portion of the channel region between the source region and the drain region and to deplete the whole channel region. Such a structure is advantageous to detect an image of low intensity but may leads to a higher series resistance between the source region and the intrinsic gate (potential barrier) portion.

In a two-dimensional image pick-up device, it may sometimes be more convenient to reverse bias the source region with respect to the gate region. In such a case, the gate region is preferably small and positioned near the source region to be wholly subjected to the influence of the source potential. When a charge transfer frame is separately provided in addition to an image pick-up frame, simultaneous read-out of a multiplicity of image pick-up units can be employed.

Figure 8:
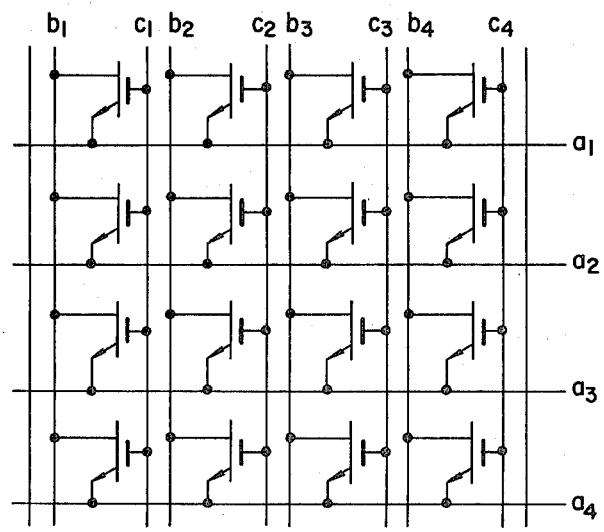
FIG. 8 is a partial circuit diagram of the solid image pick-up device shown in FIGS. 7A and 7B.

FIG. 8 shows a schematic diagram of two-dimensional image pick-up device wherein the units shown in FIGS. 7A and 7B are arranged in a matrix within a planar surface. At the respective crossing points of a plurality of row lines $a_1$, $a_2$, $a_3$, ... and a plurality of column lines $b_1$, $b_2$, $b_3$, ... which are arranged so as to cross each other, there are disposed the units shown in FIGS. 7A and 7B. The respective sources of the units are connected to their corresponding row lines, and the drains are connected to their corresponding column lines. Furthermore, clear lines $c_1$, $c_2$, $c_3$, ... are disposed in parallel with the column lines $b_1$, $b_2$, $b_3$, ... and they are connected to the respective gate electrodes.

In order to read out an image information, there are carried out, for example, the following procedures. While maintaining the row line $a_1$ at zero potential, a positive voltage is applied to other row lines $a_2$, $a_3$, ... for inhibiting read-out, and a read-out positive voltage pulse is applied successively to the column lines $b_1$, $b_2$, $b_3$, ... so that the current flowing through the row line $a_1$ is detected. Following the read-out pulses, an erasing positive voltage pulse is applied to the clear lines $c_1$, $c_2$, $c_3$, ... to successively clear the units which have completed read-out. Those units located on other rows are being applied with a positive voltage to their sources, so that they are not read out nor cleared. After the read-out and clear of the first row are completed, similar operation is carried out on the second row. When the read-out is performed successively up to the final row, read-out operation is resumed on the first row. The read-out may be performed on interlace. In order to detect, with a good sensitivity, a region of low degree of irradiation, it is only necessary to elevate the voltage of the read-out pulse applied. It is also possible to intensify the reverse bias by, for example, elevating the voltage of the clear pulse and the voltage assigned to the inhibition of read-out. The voltage of read-out pulse is selected so that a sufficient precision can be obtained in the operative state. If it is intended to read out at a high speed, it is also effective to reduce the width of the pulse of read-out and to thereby increase the speed of scanning and to arrange so that a clear pulse having a relatively wide pulse width traces the read-out pulse. In such an instance, before the ending of a clear pulse applied to a unit, another clear pulse becomes applied to the next adjacent unit.

Figure 9:
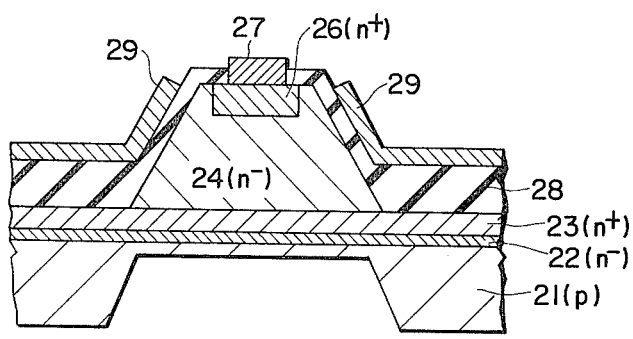
FIGS. 9 and 10 are diagrammatic partial sectional views of other embodiments of the solid image pick-up device of the present invention.

FIG. 9 shows a insulated-gate type image pick-up device. On top of a p type substrate 21, there is formed an n+ type drain region 23 surrounded by an n− type region 22. On top of this drain region 23 is formed an n− type region 24 which constitutes a channel region. The peripheral portions of the channel region are recessed so that the channel portion is noted to be protruding. At the apex portion of the protruding channel region, there is provided an n+ type source region 26, and a source electrode 27 is formed thereon. A gate electrode 29 is formed via an insulating layer 28. By causing the insulating layer located beneath the gate electrode 29 to have a negative electric charge, thereby forming an inversion layer at the surface portion, the device will operate in a way similar to the insulated-electrode junction gate type structure shown in FIGS. 7A and 7B. Arrangement may be made so that a bias voltage is always applied to the gate electrode 9. In the structure of FIG. 9, it will be noted that the light-receiving surface is provided on the bottom surface of the device to present a rear face light incidence type structure.

Figure 10:
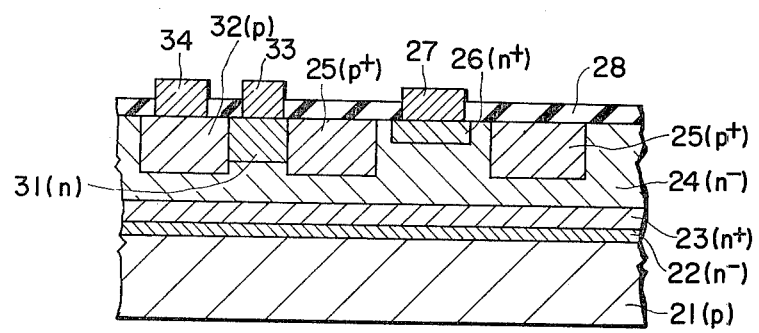

FIG. 10 is a modification of the embodiments shown in FIGS. 7A and 7B. In FIG. 10, the insulated gate electrode is not shown, and there is provided a switching bipolar transistor. The gate region 25 is used to serve as an emitter, and there are formed a base region 31 and a collector region 32. On top of this base region 31 is provided a base electrode 33. On top of the collector region 32 is provided a collector electrode 34. The base region 31 of this example is shown as being a region separate from the channel region 24. The depletion layer around the gate region 25 electrically isolates the channel region 24 from the other regions. This embodiment has the advantage that, because clear is carried out through a transistor, a high-speed operation can be performed.

Figure 11A:
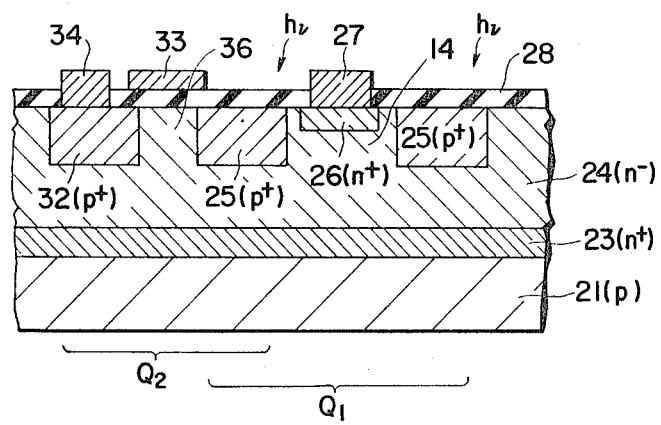
Figure 11B:
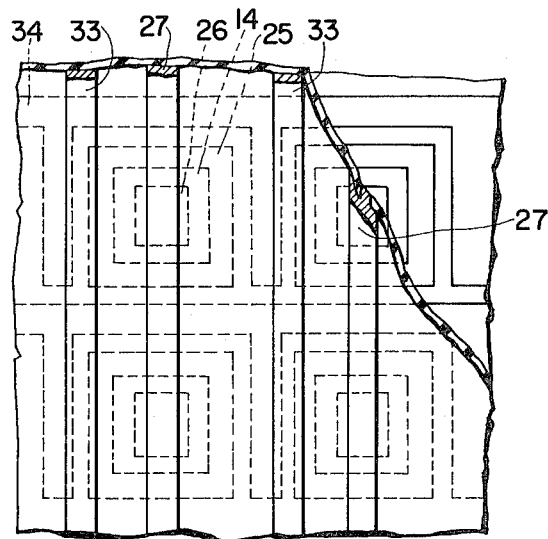
Figure 11D:
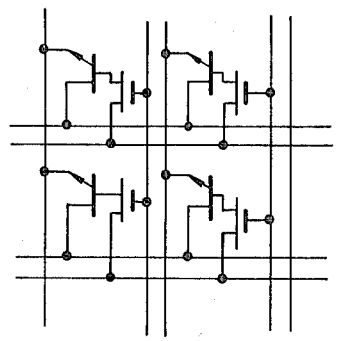
Figure 11C:
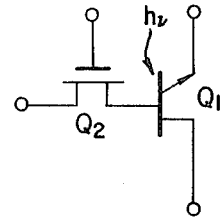

Another embodiment of the image pick-up device utilizing an insulated gate transistor as a switching transistor is shown in FIGS. 11A to 11D. In FIG. 11A, a stripe shaped n+ type drain region 23 is formed on a p type substrate 21. An n− type epitaxial layer 24 is grown thereon. A p+ type gate region 25 is formed in the n− type region 24 to substantially surround a channel region 14. Simultaneously, another p+ type region 32 is formed in the n− type region adjacent to but separated from the p+ type gate region 25. An n+ type source region 26 is formed in the channel region 14. As is seen in the plan view of FIG. 11B, the p+ type gate region 25 surrounds the n+ type source region 26 via the n− type channel region 14. Along one outer edge of p+ type gate region 25, the p+ type region 32 is formed. The p+ type regions 25 and 32 and the intervening n− type region 36 constitute a pair of current electrode regions and a channel region of an insulated gate transistor. A thin insulating film 28 is formed on the semiconductor surface and selectively apertured. A source electrode 27 of the photo-transistor and a drain electrode 34 of the switching transistor is formed on the respective regions 26 and 32 through apertures. An insulated gate electrode 33 is formed on the insulating film 28 above the channel region 36 of the switching transistor. This insulated switching transistor may either have a saturated characteristic or have an unsaturating characteristic. In other words, the channel region 36 may be either partially or wholly depleted by the potential of the drain region 32. An equivalent circuit diagram of an image pick-up unit is shown in FIG. 11C. An insulated gate transistor $Q_2$ is merged in the gate region of a static induction photo-transistor $Q_1$. When such image pick-up units are arranged in two-dimensional matrix as shown in FIG. 11D, a two dimensional image pick-up device is formed. In FIG. 11D, the drain electrodes of the switching transistors $Q_2$ are wired independently. This arrangement is effective to establish charged (depleted) clear state of the gate region 25.

Figure 12:
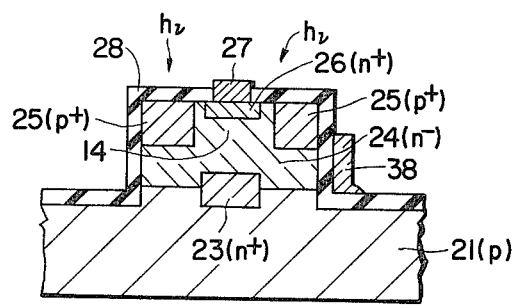
FIG. 12 is a schematic sectional view of another embodiment of an image pick-up element according to another embodiment of the invention.

A simplified structure is shown in FIG. 12. In FIG. 12, an n+ type source region 23 is formed in a p type substrate and an n− type epitaxial layer 24 is selectively formed thereon. A p+ type gate region 25 is formed in the n− type region 24 to surround a channel region 14. An n+ type drain region is formed in the upper surface portion of the channel region 14. An insulating film 28 passivates the semiconductor surface. An insulated electrode 38 is formed on the insulating film 28 to bridge the p+ type gate region 25 and the p type substrate 21. Namely, an insulated gate transistor is formed by the gate region 25, part of the n− type region 24 and the p type substrate 21 with the insulated gate structure on the n− type channel region 24. A drain electrode 27 is formed on the drain region 26. Selective epitaxial growth may be replaced with selective etching.

In this embodiment, the gate region can be short-circuited to the source region through an insulated gate transistor which is formed only by providing an electrode on an insulating film.

Some embodiments of the present invention have been stated above. However, the present invention is not limited to these embodiments. It is possible to reverse the conductivity types of the respective regions, and to select other kinds of semiconductor materials, and also to combine the structures of those embodiments mentioned above, and further to incorporate various structures known in the field of semiconductor device techniques.

What is claimed is:

1. A static induction transistor type semiconductor photo-electric converter having a substrate and including at least one unit, each unit comprising:

a high-resistivity semiconductor region of one conductivity type having an impurity concentration of the order of $1 \times 10^{14}$ cm$^{-3}$ and predetermined dimensions constituting at least one current channel having two ends;

a pair of current electrode means comprising low-resistivity semiconductor regions of said one conductivity type and connected to said two ends of said current channel for receiving a main voltage from an external voltage source;

a control electrode means formed adjacent to and surrounding said current channel for controlling current between said current electrode means, said control electrode means including a low resistivity semiconductor storage region of the other conductivity type opposite to said one conductivity type and having a low resistivity as compared to the resistivity of said high-resistivity region and formed adjacent to said current channel, and further including an insulating film formed on said low resistivity semiconductor storage region and a conductive electrode formed on said insulating film which comprises a storage capacitor, said control electrode means being capable of storing charge carriers of the other conductivity type opposite to said one conductivity type and thereby varying the potential thereof to control current between said current electrode means;

a light receiving means formed in the neighborhood of said current channel for introducing external light at least into part of said semiconductor region; and at least one depletion layer formed in said semiconductor region extending from said control means to selectively pinch off said current channel due to said impurity concentration and predetermined dimensions, and forming a potential barrier in said current channel having a height in accordance with the potential of said control means and the potential of one of said current electrode means, said current electrode means and said current channel being configured substantially perpendicular with respect to said substrate.

2. A static induction transistor type semiconductor photo-electric converter according to claim 1, wherein: the converter includes a multiplicity of units of said converter and specific device isolation means.

3. A static induction transistor type semiconductor photo-electric converter according to claim 2, wherein: said multiplicity of units are arranged in one dimension.

4. A static induction transistor type semiconductor photo-electric converter according to claim 2, wherein: said multiplicity of units are arranged in a two-dimensional matrix shape having a plurality of rows and a plurality of columns.

5. A static induction transistor type semiconductor photo-electric converter according to claim 2, wherein: each said unit further comprises a switching transistor formed in said semiconductor chip and including said semiconductor storage region as one current electrode region.

6. A static induction transistor type semiconductor photo-electric converter according to claim 5, wherein: said switching transistor further comprises another current channel region formed of part of said high resistivity semiconductor region, another insulating film formed on said another current channel region, another conductive electrode formed on said another insulating layer, and another low resistivity semiconductor region of said other conductivity type formed adjacent to said another current channel region.

* * * * *